United States Patent [19]

Okumura et al.

[11] Patent Number: 5,032,882
[45] Date of Patent: Jul. 16, 1991

[54] SEMICONDUCTOR DEVICE HAVING TRENCH TYPE STRUCTURE

[75] Inventors: Yoshinori Okumura; Takayuki Matsukawa, both of Hyogo, Japan

[73] Assignee: Mitsubishi Denki Kabushiki Kaisha, Tokyo, Japan

[21] Appl. No.: 529,693

[22] Filed: May 29, 1990

Related U.S. Application Data

[63] Continuation of Ser. No. 288,313, Dec. 22, 1988, abandoned.

[30] Foreign Application Priority Data

Dec. 28, 1987 [JP] Japan .................. 62-333416

[51] Int. Cl.⁵ .............. H01L 29/10; H01L 29/78; H01L 29/34; H01L 29/06
[52] U.S. Cl. ................... 357/23.6; 357/54; 357/55; 357/59; 357/51
[58] Field of Search ............. 357/23.6, 54, 59, 55, 357/51, 23.4

[56] References Cited

U.S. PATENT DOCUMENTS

| | | | |
|---|---|---|---|
| 4,630,237 | 12/1986 | Miura et al. | 357/41 |
| 4,683,643 | 8/1987 | Kakajima et al. | 357/23.4 |
| 4,707,457 | 11/1987 | Erb | 357/23.6 X |
| 4,786,953 | 11/1988 | Morie et al. | 357/23.4 |
| 4,845,539 | 7/1989 | Inoue | 357/23.4 |

FOREIGN PATENT DOCUMENTS

| | | | |
|---|---|---|---|
| 3525418 | 1/1986 | Fed. Rep. of Germany | 357/23.6 |
| 0177066 | 4/1986 | Fed. Rep. of Germany | 357/23.6 |
| 0333416 | 12/1987 | Japan . | |

OTHER PUBLICATIONS

"An Isolation-Merged Vertical Capacitor Cell for Large Capacity DRAM", Nakajima et al., IEDM-84, pp. 240–243.
"A New Soft-Error Immune DRAM Cell with a Transistor on a Lateral Epitaxial Silicon Layer", Kubota et al., IEDM-87, pp. 344–347.

Primary Examiner—Rolf Hille
Assistant Examiner—Mahshid Saadat
Attorney, Agent, or Firm—Lowe, Price, LeBlanc and Becker

[57] ABSTRACT

A semiconductor device comprises a P type semiconductor substrate (1) with a trench (12) formed on a main surface thereof. An N type drain region (15a) is formed at the bottom surface portion of the trench (12). An insulating layer (19c) is formed on the surface of the substrate (1) including a sidewall and the bottom surface of the trench (12), the layer having a hole (20b) whose bottom surface being at least the surface of the drain region (15a). A conductive layer (18) is formed on the insulating layer (19c) which is contact with the drain region (15a) at the bottom surface of the trench (12) through the hole (20b). The conductive layer (18) consititues a drain electrode. A gate (13) is interposed between the conductive layer (18) and the sidewall of the trench (12), formed along the sidewall of the trench (12) and insulated by the insulating layer (19c). An N type source region (15b) is formed on the surface of the substrate (1) including a portion of the sidewall of the trench (12). The drain electrode, the source electrode and the gate (13) constitute a MOS type field effect transistor (T2). At least a portion of a channel region is formed on the sidewall portion of the trench (12) between the drain region (15a) and the source region (15b). A capacitor (C2) is formed on the surface of the substrate (1) to be connected to the field effect transistor (T2).

18 Claims, 10 Drawing Sheets

SEMICONDUCTOR DEVICE HAVING TRENCH TYPE STRUCTURE

This application is a continuation application of application Ser. No. 388,313 filed Dec. 22, 1988, now abandoned.

BACKGROUND OF THE INVENTION

1. Field of the Invention

The present invention generally relates to a semiconductor devices and, more specifically, it relates to a semiconductor device having a trench type structure suitable for improving density and degree of integration.

2. Description of the Background Art

Since the present invention provides optimal effect when applied to a dynamic type random access memory (hereinafter referred to as DRAM), the description will be given of a DRAM in the following. DRAMs have been well known. FIG. 1 is a block diagram showing one example of a whole structure of a conventional DRAM.

Referring to FIG. 1, the DRAM comprises a memory cell array 10 serving as memory portion including a plurality of memory cells a row decoder 200 and a column decoder 300 connected to an address buffer for selecting an address thereof, and an input/output interface portion including a sense amplifier connected to an input/output circuit. The plurality of memory cells serving as memory portion are connected to respective intersections of bit lines connected to the column decoder 300 and the word lines connected to the row decoder 200, formed in a matrix, whereby constituting the memory cell array 100. Upon reception of an externally applied row address signal and a column address signal, a memory cell is selected which is at an intersection of one word line and one bit line respectively selected by the row decoder 200 and the column decoder 300. Data is written into and read from the selected memory cell. The instruction for the reading/writing of the data is carried out in accordance with a reading/writing control signal applied to a control circuit.

The data are stored in the memory cell array 100 of N ($=n \times m$) bits. The address information in association with the memory cell to which reading/writing is to be carried out is stored in the row and column address buffers. When a specific word line is selected (one word line out of n word lines) by the row decoder 200, m bit memory cells are coupled to the sense amplifiers through bit lines. Thereafter, a specific bit line is selected (one bit line out of m bit lines) by the column decoder 300, whereby one sense amplifier is coupled to the input/output circuit, and reading or writing is carried out in accordance with an instruction from the control circuit.

FIG. 2 is an equivalent circuit diagram of one memory cell 50 of a DRAM for illustrating the writing/reading operation of the memory cell. Referring to the figure, the memory cell 50 comprises a set of a field effect transistor T and a capacitor C. The field effect transistor T has its gate electrode connected to a word line 41, one of the source-drain electrodes connected to one electrode of the capacitor C, and the other one of the source/drain electrodes connected to a bit line 11. In data writing, the field effect transistor T becomes conductive by an application of a prescribed voltage to the word line 41, so that the charges applied to the bit line 11 are stored in the capacitor C. Meanwhile, in data reading, the field effect transistor T becomes conductive upon an application of a prescribed voltage to the word line 41, so that the charges stored in the capacitor C are taken out through the bit line 11.

Recently, semiconductor devices have been remarkably developed. As the degree of integration and the density of the devices have been improved, the patterns of each of the semiconductor elements formed therein have been smaller and smaller. Semiconductor devices having large capacitances which are compact and capable of high speed operation are strongly desired. In order to meet the demands, the patterns of each semiconductor elements must be further miniaturized. The memory cells in the above described DRAMs are the typical examples. Not only the size of each unit element such as the transistor, capacitor or the like but also the size of the memory cell constituted by these elements must be minimized so as to reduce the area of occupation on the semiconductor substrate. In order to reduce the area occupied by the memory cell region, various memory cell structures have been developed.

FIG. 3 is a partial plan view of a conventional DRAM showing a planar structure of a memory cell array portion having a stacked capacitor cell structure. FIG. 4 is a cross sectional view taken along the line IV—IV of FIG. 3.

Referring to FIGS. 3 and 4, each memory cell comprises a set of field effect transistor (MOS FET: hereinafter referred to as a transistor) T1 and a capacitor C1, which is isolated from adjacent memory cells. A gate electrode constituting each transistor T1 is formed as a transfer gate 2 so as to be integrated with the word line. A bit line 11 is formed on the transfer gate 2, being insulated from the transfer gate 2 and crossing orthogonally therewith. The bit line 11 is connected to each transistor T1 constituting the memory cell through a bit line contact hole 10b.

The transistor T1 is constituted by a transfer gate 2 which also serves as the word line, and $n^+$ regions 4 which will be the source region 4b and the drain region 4a arranged on both sides of the transfer gate 2. Two transfer gates 2 formed on a thin gate oxide film 3a fall on a p type semiconductor substrate (hereinafter referred to as a substrate) extend on both sides of the bit line contact hole 10b. The drain region 4a is formed on a main surface of the substrate 1 over a wide region, which is connected to the bit line 11 through the bit line contact hole 10b. The source region 4b is formed to be connected to the capacitor C. The substrate 1, the transfer gates 2 and the gate oxide film 3a are formed of, for example, P type silicon single crystal, a polycrystalline silicon film and a silicon oxide film, respectively.

The capacitor C1 is arranged adjacent to the transistor T1 which is structured as described above. The capacitor C1 has opposing electrodes comprising a capacitor cell plate (hereinafter referred to as a cell plate) 7 for applying a voltage, formed of a polycrystalline silicon film or the like, and a capacitor storage node (hereinafter referred to as a storage node) 8 of a polycrystalline silicon film or the like formed below the cell plate 7. A capacitor gate oxide film 3b is interposed between the opposing electrodes. A storage node insulating film 9a is formed between the substrate 1 and the lower surface of the capacitor C1. A transfer gate insulating film 9b is formed on the upper surface of the capacitor C1, whereby the capacitor C1 is structured to be insulated from other portions. A storage node contact hole 10a is provided at a portion of the storage node insulating film 9a. The storage node 8 is connected Consequently, the capacitor C1 is connected to the transistor T1. A transfer gate 13 having rectangular cross section and also serving as a word line is arranged on the capacitor C1.

A channel cut layer 6 is formed below the capacitor C1, with a portion of the layer being in contact with the source region 4b. The channel cut layer 6 is formed of a p+ layer in which impurities of the same conductivity type as the substrate 1 are doped to a high density. Between the channel cut layer 6 and the storage node insulating film 9a, an isolating oxide film 5 is provided, which is formed of a thick silicon oxide film derived from selective oxidation of the substrate 1, for example.

A bit line insulating film 9c formed of a silicon oxide film or the like is deposited above the substrate 1 to cover the transfer gate 2. A bit line contact hole 10b is provided in the bit line insulating film 9c. The bit line 11 formed on the bit line insulating film 9c is in contact with the drain region 4a through the bit line contact hole 10b. The drain region 4a is shared by two transistors T1. The memory cell constituted by the transistor T1 and the capacitor C1 is isolated from adjacent memory cells by means of the isolating oxide film 5 and the channel cut layer 6.

The conventional DRAM is structured as described above with the transistor T1 formed flat on the main surface of the substrate 1. Therefore, the drain region 4a constituting the transistor T1 and the bit line 11 are connected with each other through the bit line contact hole 10b. As the degree of integration and the density have been further improved and the patterns in each semiconductor element have become smaller and smaller, problems such as a so called short channel effect, difficulty in electrically connecting electrode wires and so on are generated.

The short channel effect is caused when the length of a channel formed below the transfer gate 2 becomes short, in which charges in the channel region are strongly influenced not only by the gate voltage but also the electric field of the source region 4b and the drain region 4a, the potential distribution and so on, resulting in a decrease of the threshold voltage. The source-drain breakdown voltage is also decreased since the depletion layer on the side of the drain region 4a comes nearer the source region 4b.

The latter mentioned problem is caused as the bit line contact hole 10b becomes smaller along with the minimization of the size of each semiconductor element, the bit line 11 can not fully fill the bit line contact hole 10b, so that the contact between the drain region 4a with the bit line 11 becomes imperfect. Consequently, good and stable electrical connection between electrode wirings becomes difficult.

The above described two problems result in the degradation of electrical characteristics of the transistor T1.

Now, in the structure of the DRAM described in the foregoing, the memory cell is constructed by connecting the capacitor C1 to the transistor T1, and respective memory cells are arranged in parallel to each other on the main surface of the substrate 1. Consequently, the size $l_{p1}$ of the memory cell is relatively large, as shown in FIG. 4. Therefore, as the degree of integration and the density are improved, the size of the storage node contact hole 10a must be made smaller as well as the bit line contact hole 10b. Consequently, the electrical connection between the storage node 8 and the source region 4b becomes difficult. In addition, since the degree of integration and the density are improved, the area occupied by the capacitor C1 on the substrate 1 is limited, so that the capacitance can not be enlarged.

As described above, the conventional DRAM structure has disadvantages that the electrical characteristics of the transistor T1 are degraded and improvement of the degree of integration and the density of the memory cells are suppressed.

In order to further improve the degree of integration and the density, a dynamic memory cell having 1 transistor and 1 capacitor in which a vertical transistor is formed on a sidewall portion of a trench for capacitor is disclosed in IEDM technical Digest p. 714~717. Dec. 1~4, 1985 "A TRENCH TRANSISTOR CROSS-POINT DRAM CELL". According to this article, the whole memory cell in the DRAM is buried in a trench. Namely, the most advantageous structure for reducing the area of occupation is disclosed. However, in this structure, a ring buried contact is formed on a sidewall portion of the trench so as to provide electrical connection between the electrodes and the impurity regions. The process of forming the buried contact requires tricky techniques, and the manufacturing process becomes troublesome. In addition, impurity diffused layers are used for the bit lines in this structure, so that the wiring capacitances are increased.

SUMMARY OF THE INVENTION

An object of the present invention is to provide a semiconductor device suitable for improving degree of integration and density.

Another object of the present invention is to provide a semiconductor device having high density providing good electrical connection.

A further object of the present invention is to provide a semiconductor device having high density in which transistors having superior electrical characteristics can be formed.

A still further object of the present invention is to provide a semiconductor device in which transistors having high density are provided, which are capable of preventing short channel effect.

A still further object of the present invention is to provide a semiconductor memory device which can be easily manufactured to improve density of memory cells and without unduly increasing wiring capacitance.

A semiconductor device having a trench type structure in accordance with the present invention comprises a semiconductor substrate, a first impurity region, an insulating layer, a conductive layer, a gate, and a second impurity region. The semiconductor substrate is of a first conductivity type and has a main surface and a trench formed thereon. The first impurity region is formed on the semiconductor substrate at the bottom surface portion of the trench, and has a second conductivity type which is opposite to the semiconductor substrate. The insulating layer is formed on the main surface of the semiconductor substrate including the sidewall and the bottom surface of the trench, and has a hole whose bottom surface being at least the surface of the first impurity region. The conductive layer is in contact with the first impurity region at the bottom surface of the trench through the hole, and is formed on the insulating layer. The conductive layer constitutes a first electrode. The gate is interposed at least between the conductive layer and the sidewall of the trench, formed along the sidewall of the trench and insulated by the insulating layer. The second impurity region is of the second conductivity type formed on the main surface of the semiconductor substrate including a portion of the sidewall of the trench, which region is connected to a second electrode. The first and second electrodes and the gate constitute a field effect element, and at least a portion of a channel region is formed on the sidewall of the trench between the first and second impurity regions.

Preferably, the semiconductor device further comprises an insulating layer formed on the conductive layer having a hole with the bottom surface being at least the surface of the conductive layer, and a wiring layer formed on the insulating layer, the wiring layer being in contact with the conductive layer through the hole. The surface region of the conductive layer with which the wiring layer is in contact should be formed larger than the surface region of the first impurity region with which the conductive layer is in contact. In addition, the semiconductor device should further comprise a capacitance portion connected to the field effect element on the main surface of the semiconductor substrate. The capacitance portion comprises a second conductive layer formed in contact with the second impurity region, a capacitor insulating film formed on a surface of the second conductive layer, and a third conductive layer formed on the capacitor insulating film, whereby constituting a capacitor for storing charges.

According to the present invention, the first impurity region is provided at a bottom surface portion of the trench formed in the main surface of the substrate. Therefore, the impurity region can be formed at the bottom surface portion of the trench with a prescribed size irrespective of the region occupied by respective semiconductor devices formed on the main surface of the substrate. Consequently, the area of occupation on the main surface of the substrate can be reduced. In addition, a conductive layer capable of providing good and stable connection to the impurity region formed on the bottom surface portion of the trench can be formed. The position of the impurity region can be changed by adjusting the depth of the trench. Consequently, the length of a channel region formed between the impurity region and the impurity region formed on the main surface of the substrate can be adjusted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be hereinafter described with reference to the figures. Descriptions of portions overlapping with the background art will be appropriately omitted.

Figure 5:
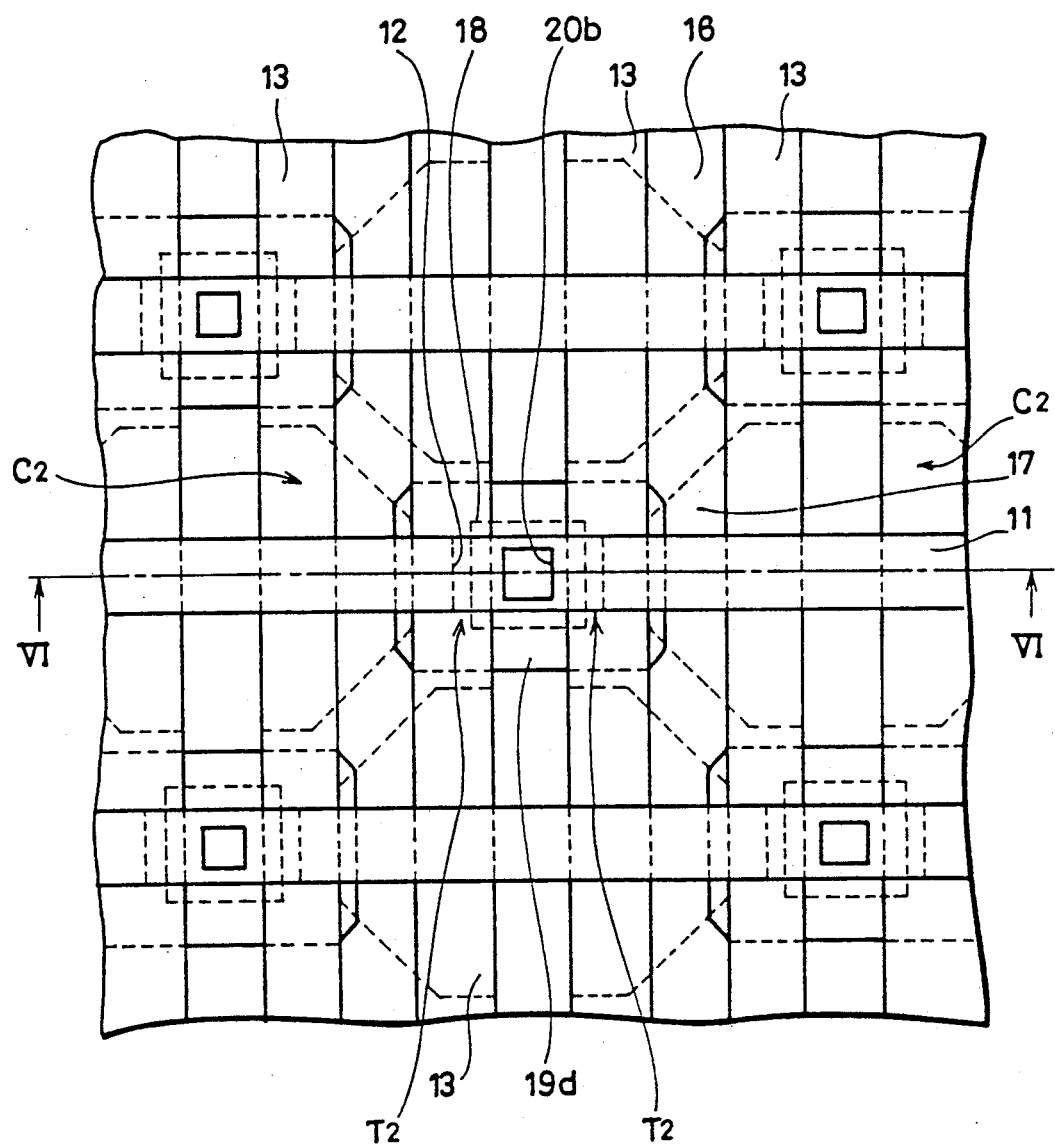
FIG. 5 is a partial plan view showing a memory cell forming region of a DRAM as a semiconductor device in accordance with one embodiment of the present invention.
Figure 6:
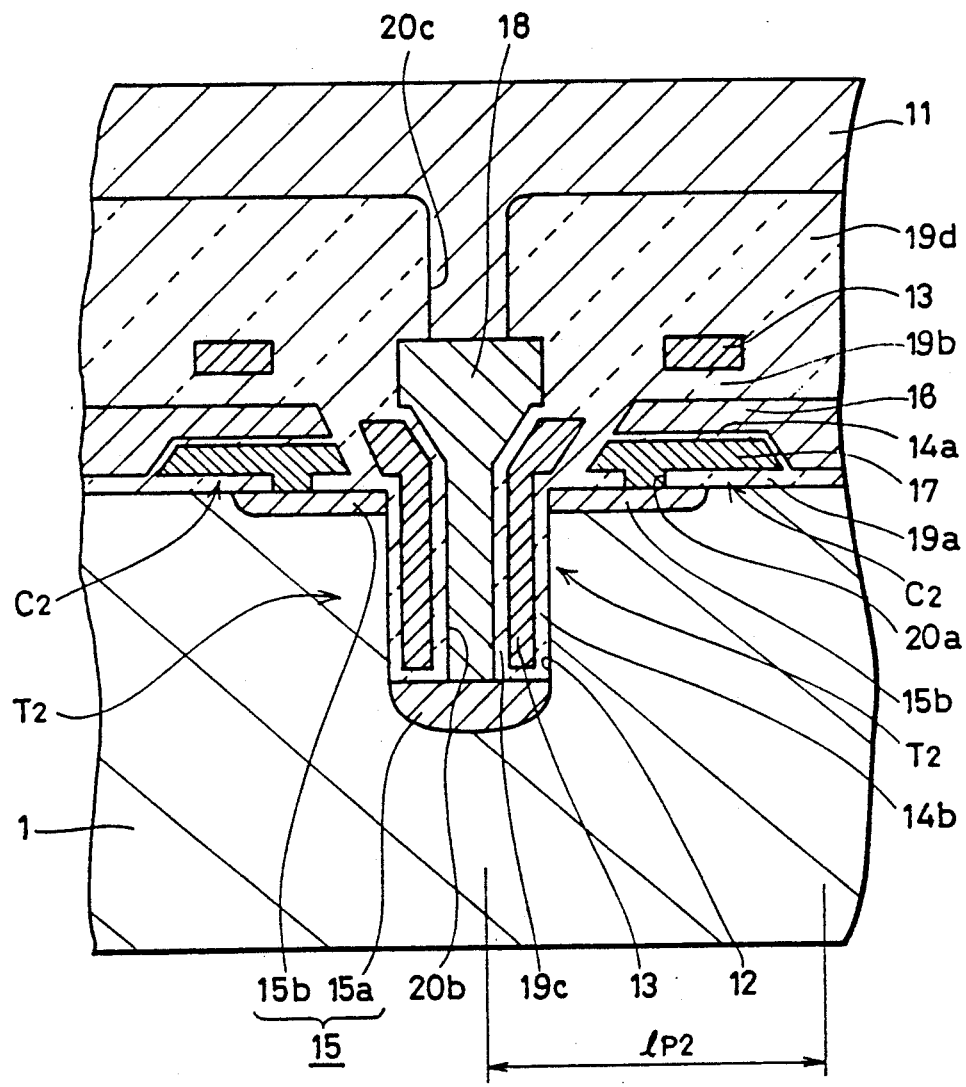
FIG. 6 is cross sectional view taken along the line VI—VI of FIG. 5.

FIG. 5 is a partial plan view of showing a planar arrangement of a memory cell array region of a DRAM as a semiconductor device in accordance with one embodiment of the present invention. FIG. 6 is a cross sectional view taken along the line VI—VI of FIG. 5.

Referring to FIGS. 5 and 6, each memory cell is constituted by a set of a field effect transistor T2 and a capacitor C2, formed in a region isolated from adjacent memory cells. A gate electrode constituting each transistor T2 is formed as a transfer gate 13 so as to be integrated with the word line. A bit line 11 is formed on the transfer gate 13 being insulated from the transfer gate 13 and intersecting orthogonally therewith. The bit line 11 is connected to the memory cell through a bit line contact hole 20c.

The transistor T2 is formed along a side wall portion of a trench 12 provided in the substrate 1 and comprises a transfer gate 13, a drain region 15a and a source region 15b. The transfer gate 13 is formed higher than the level of the main surface of the substrate 1 along the sidewall portion of the trench 12 to be integrated with the word line. The transfer gate 13 is formed with a transfer gate oxide film 14b formed along the sidewall portion of the trench 12 interposed between itself and the sidewall portion. The drain region 15a is an n+ region formed on the substrate 1 at the bottom surface portion of the trench 12. The source region 15b is an n+ region formed on the main surface of the substrate 1 around the trench 12 including the upper portion of the sidewall of the trench 12.

The capacitor C2 is formed to be connected with the source region 15b constituting the transistor T2, and has opposing electrodes formed of a cell plate 16 and a storage node 17. The cell plate 16 will be an electrode for applying a voltage of the capacitor C2. The storage node 17 is an electrode opposing to the cell plate 16 and is provided below the cell plate 16 with a capacitor gate oxide film 14a interposed therebetween. The storage node 17 is connected to the source region 15b constituting the transistor T2.

The electrode 18 adapted to be inserted at the center of the trench 12 has its upper portion connected to the bit line 11 and the lower portion connected to the drain region 15a constituting the transistor T2 at the bottom surface portion of the trench 12. An interlayer insulating film 19 comprises a storage node insulating film 19a, a transfer gate insulating film 19b, an electrode insulating film 19c and a bit line insulating film 19d. The storage node insulating film 19a exists between the storage node 17 and the substrate 1 for the isolation of the two. The transfer gate insulating film 19b is formed above the cell plate 16 for insulating the transfer gate 13. The electrode insulating film 19c is formed for insulating the electrode 18 adapted to be inserted in the trench 12 and the transfer gate 13 formed along the sidewall portion of the trench 12. The bit line insulating film 19d is deposited for insulating the bit line 11 from each of the semiconductor devices formed therebelow.

In this manner, the transistor T2 is arranged along the sidewall portion of the trench 12 formed in the main surface of the substrate 1 without occupying a large area on the main surface of the substrate 1. Consequently, the drain region 15a is arranged at the substrate 1 at the bottom surface portion of the trench 12, and the source region 15b is arranged at the main surface of the substrate 1 around the trench 12 including the upper portion of the sidewall portion of the trench 12. Therefore, the transfer gate 13 is arranged along the sidewall portion of the trench 12 so as to form a channel region between the drain region 15a and the source region 15b.

The method for manufacturing the memory cell forming region structured as described above will be hereinafter described with reference to FIGS. 7A to 7F.

Figure 7A:
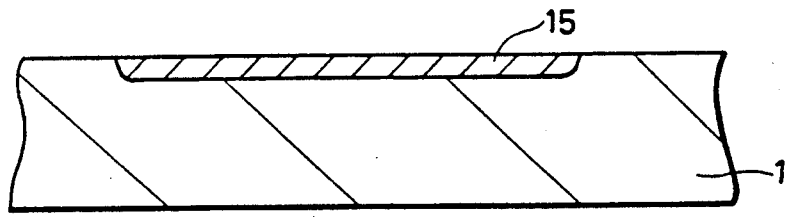
FIGS. 7A, 7B, 7C, 7D, 7E and 7F are cross sectional views showing the cross section of FIG. 6 in the order of manufacturing steps.

First, referring to FIG. 7A, a silicon oxide film, for example, is formed on the main surface of the substrate 1, and thereafter, patterning is carried out by photolithographic technique so as to selectively remove the silicon oxide film in accordance with a prescribed pattern. Impurity ions having opposite conductivity to the substrate 1, namely, n type are implanted to the substrate 1 using the silicon oxide film as a mask. Thereafter, n type impurities implanted in the substrate 1 are diffused by thermal processing, thereby forming an n+ region 15.

Figure 7B:
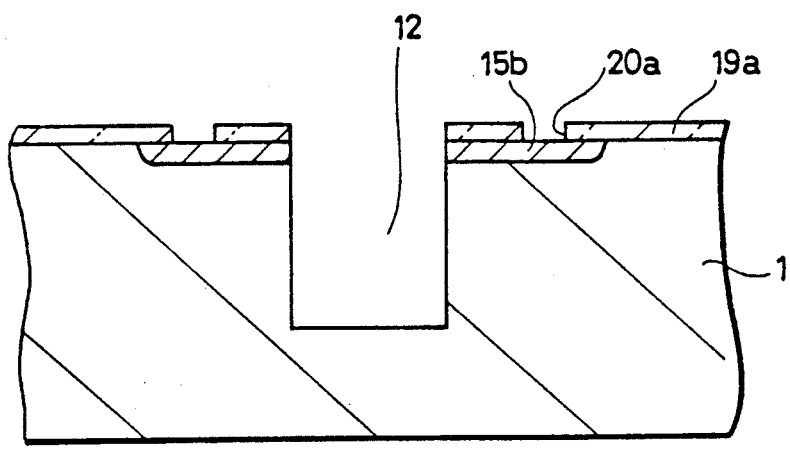

Referring to FIG. 7B, the silicon oxide film which was used as a mask is removed, and thereafter, a silicon oxide film, for example, is formed on the main surface of the substrate 1 to a prescribed thickness by chemical vapor deposition method and the like. Patterning in accordance with the photolithographic technique is carried out on the silicon oxide film, so that a portion of the silicon oxide film is selectively removed and a portion of the main surface of the n+ region is exposed. The selectively removed silicon oxide film will be the storage node insulating film 19a. Thereafter, reactive iron etching (hereinafter referred to as RIE) using anisotropic ion seed is carried out to remove the portion of the n+ region 15 with the main surface exposed to a prescribed depth. By doing so, the trench 12 is formed. The trench 12 has its sidewall portion approximately vertical to the main surface of the substrate 1 and its bottom surface portion approximately horizontal therewith. A storage node contact holes 20a are formed on the silicon oxide film above the n+ region 15 on both sides of the opening of the trench 12 by photolithographic technique. The n+ region 15 and the silicon oxide film formed thereon will be the source region 15b and the storage node insulating film 19a, respectively.

Figure 7C:
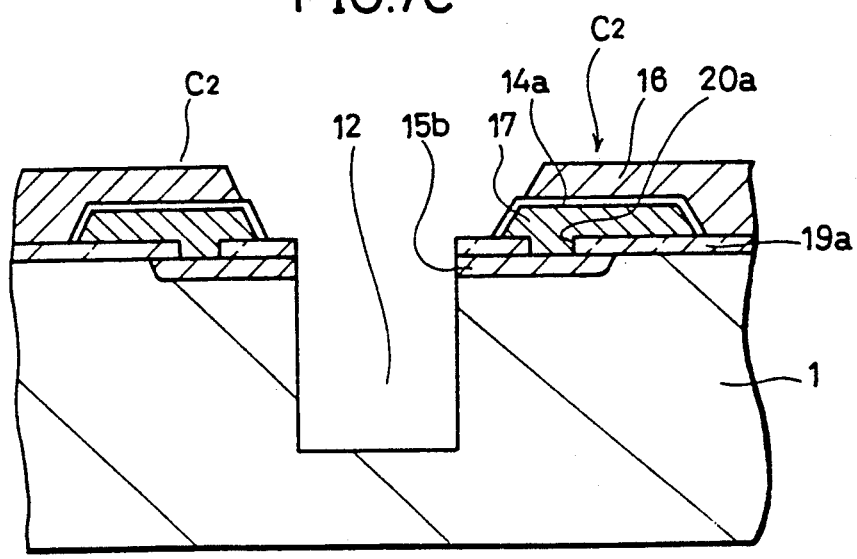

Referring to FIG. 7C, a polycrystalline silicon film doped with n type impurities is deposited on the entire surface of the substrate 1 to a prescribed thickness by chemical vapor deposition method or the like. Patterning is carried out by photolithographic technique on the polysilicon film, and a portion of the polycrystalline silicon film is selectively left on the storage node insulating film 19a. A storage node 17 is formed on the storage node insulating film 19a in this manner. The storage node 17 is connected to the source region 15b through the storage node contact hole 20a. Thereafter, a thin oxide film is formed on the entire surface by thermal oxidation method or the like. Thereafter, a polycrystalline silicon film or the like doped with n type impurities is deposited to a prescribed the thickness by chemical vapor deposition method or the like. Patterning is carried out by photolithographic technique, whereby the oxide film and the polycrystalline silicon film formed in and around the trench 12 are selectively removed. By doing so, the capacitor gate oxide film 14a is formed to cover the storage node 17, and a cell plate 16 is formed on the capacitor gate oxide film 14a except on the side of the trench 12 and on the storage node insulating film 19a. Thus, the capacitor C2 is formed.

Figure 7D:
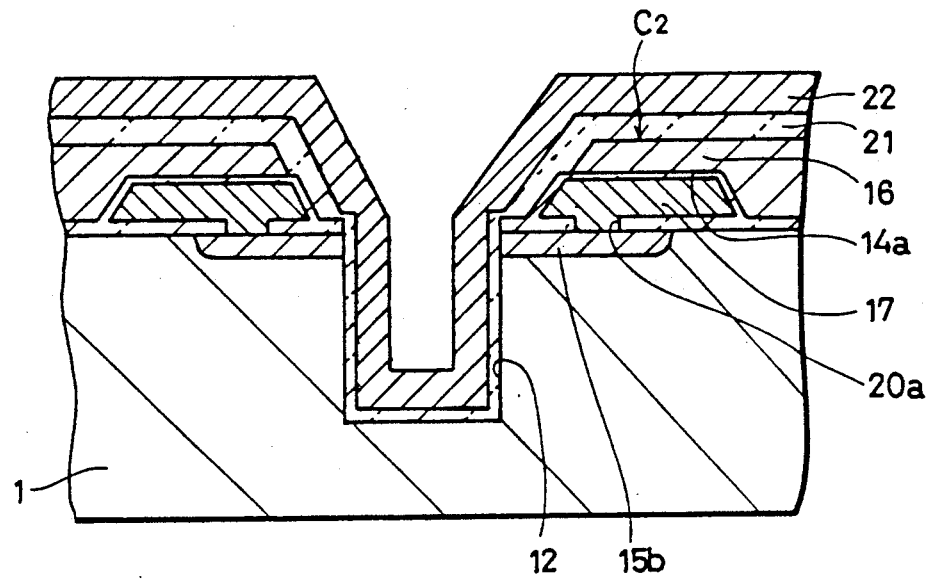

Referring to FIG. 7D, a thermal oxide film 21 formed of a silicon oxide film is formed by thermal oxidation or the like on the entire surface to have a prescribed film thickness on the inner wall surface of the trench 12. Thereafter, a conductive film 22 formed of polycrystalline silicon film or the like is deposited on the entire surface by chemical vapor deposition method or the like to have the thickness of about ⅓ of the length of the shorter side of the opening of the trench 12. The thickness of the thermal oxide film 21 is thinner on the oxide film and on the insulating film and it becomes thick on the cell plate 16, dependent on the underlying material.

Figure 7E:
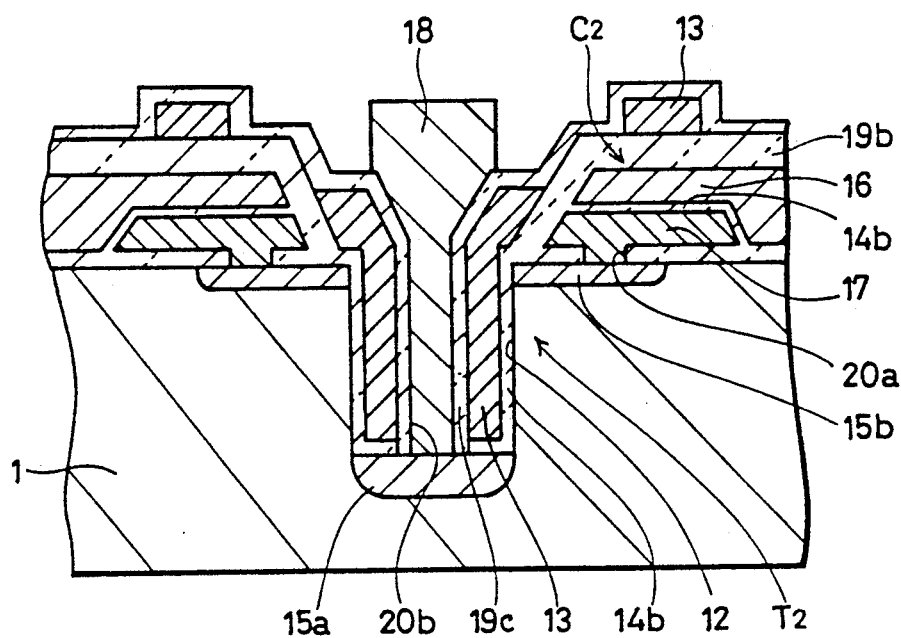

Referring to FIG. 7E, the unnecessary portions of the conductive film 22 and the thermal oxide film 21 are selectively removed successively by patterning utilizing photolithographic technique. Consequently, the thermal oxide film 21 is left from the bottom surface portion of the trench 12 to the cell plate 16. The conductive film 22 is left on the thermal oxide film 21 at the portion extending from the bottom surface portion of the trench to the main surface portion of the substrate 1 and on the portion above the cell plate 16.

Consequently, the transfer gate 13 is formed by the remaining conductive film 22 so as to be integrated with the word line. The transfer gate oxide film 14b is formed by the thermal oxide film 21 left along the sidewall portion of the trench 12. The transfer gate insulating film 19b is formed by the thermal oxide film 21 left on the oblique side surface portion of the capacitor C2 to the upper surface portion. Thereafter, an interlayer insulating film 19 formed of a silicon oxide film, for example, is deposited on the entire surface to cover the transfer gate 13 to a prescribed thickness by chemical vapor deposition method or the like. Patterning is carried out using photolithographic technique to selectively remove the interlayer insulating film 19 on the bottom surface portion of the trench 12. Consequently, the substrate 1 at the bottom surface portion of the trench 12 is exposed, and an electrode contact hole 20b is formed in the trench 12. The portion constituting the sidewall of the electrode contact hole 20b is formed of an electrode insulating film 19c.

Thereafter, an electrode film formed of a polycrystalline silicon film doped with N type impurities, for example, is deposited on the entire surface to a prescribed thickness by the chemical vapor deposition method or the like. Thereafter, patterning is carried out by using photolithographic technique, whereby the electrode film is selectively removed so that the film is left in and near the opening of the trench 12. In this manner, the electrode 18 is formed, which is in contact with the substrate 1 at the bottom surface portion of the trench 12. The width of the electrode 18 is narrow at the lower portion of the trench 12 and wide at the upper portion out of the trench 12. Thereafter, thermal processing is carried out and the N type impurities doped in the electrode 18 are diffused from the said contact portion. Consequently, the drain region 15a is formed at the substrate 1 at the bottom surface portion of the trench 12. In this manner, the transistor T2 is formed extending from the bottom surface portion of the trench 12 to the main surface portion of the substrate 1.

Figure 7F:
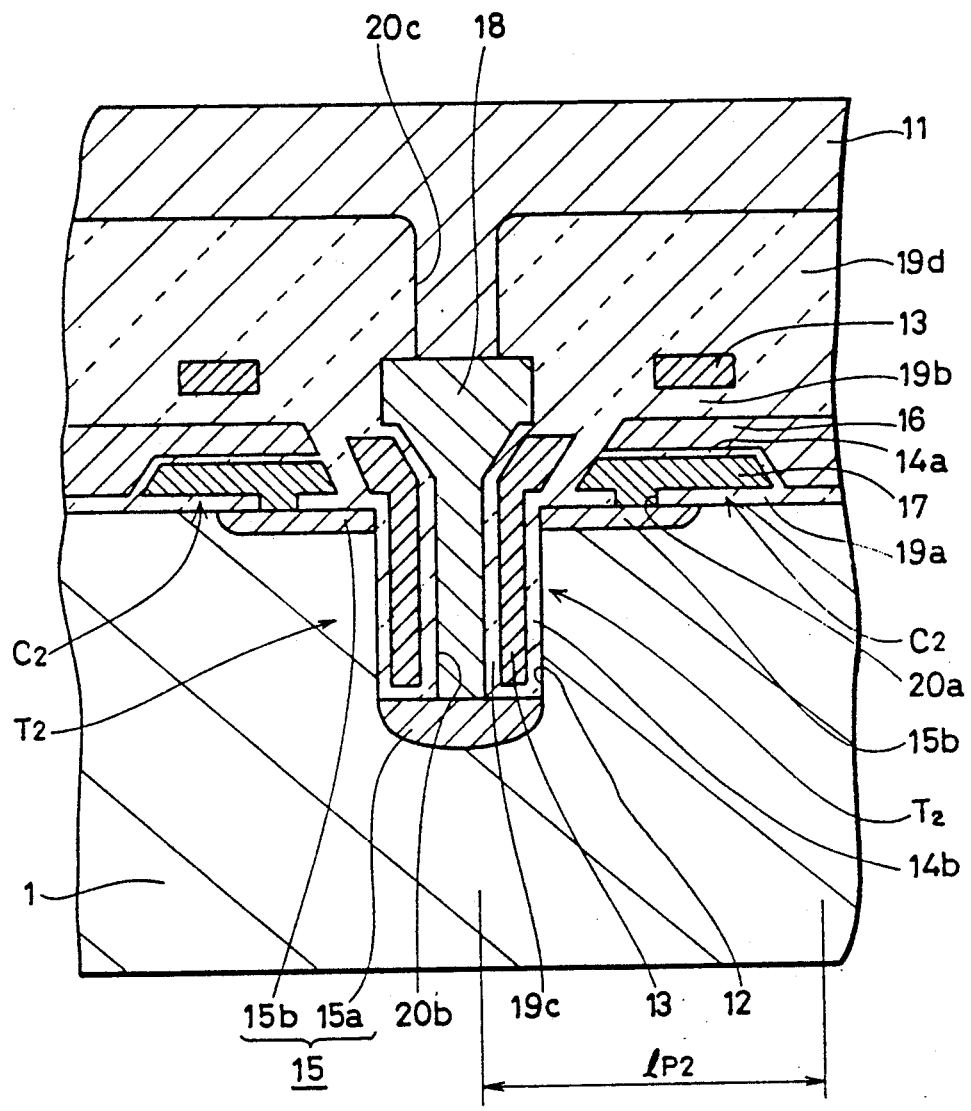

Finally, as shown in FIG. 7F, a bit line insulating film 19d formed of a silicon oxide film, for example, is deposited on the entire surface of the electrode insulating film 19c by chemical vapor deposition method or the like, to a prescribed thickness. Thereafter, patterning is carried out utilizing photolithographic technique, to form a bit line contact hole 20c approximately at the center of the electrode 18. The contact hole 20c may be formed with the pattern for forming the contact hole 20c registered with and not out of the upper surface region of the electrode 18. On this occasion, the upper surface region of the electrode 18 is relatively large, and therefore the margin for the alignment of the pattern is large. Thereafter, a polycrystalline silicon film or the like is formed on the entire surface of the bit line insulating film 19d so as to fill the bit line contact hole 20c to a prescribed thickness by the chemical vapor deposition method or the like. Patterning is carried out by photolithographic technique to selectively remove the polycrystalline silicon film or the like. In this manner, a bit line 11 having a prescribed pattern in formed, which is connected to the electrode 18 through the bit line contact hole 20c.

The memory cell of the DRAM shown in FIG. 6 is finished through the above described manufacturing steps.

In this semiconductor device shown in FIG. 6 structured in this manner, the transistor T2 is formed extending from the bottom surface portion of the trench 12 provided in the main surface of the substrate 1 to the main surface portion of the substrate 1. The transistor T2 is structured such that the drain region 15a is arranged on the bottom surface portion of the trench 12 and the channel region is formed in the vertical direction along the sidewall of the trench 12. Therefore, the horizontal area of the main surface of the substrate 1 occupied for forming the transistor T2 can be reduced. Since the channel length can be adjusted by changing the depth of the trench 12, the short channel effect can be suppressed.

The electrode 18 connected to the bit line 11 is connected to the drain region 15a through the electrode contact hole 20b provided in the trench 12, whereby a prescribed contact area is ensured in the trench 12 enabling good electrical connection.

In addition, the upper surface region (head) of the electrode 18 is on the electrode insulating film 19c and it can be formed larger than the lower portion thereof. Therefore, when the upper wiring layer which is to be connected to the electrode 18 is formed, the margin for alignment of the upper wiring layer is large. Therefore, the bit line 11 can fully fill the bit line contact hole 20c.

In addition, since the transistor T2 is structured along the sidewall of the trench 12, the size of the memory cell formed by connecting the transistor T2 to the capacitor C2 can be easily minimized. Namely, the cell size $l_{F2}$ can be minimized as shown in FIG. 6.

Figure 8:
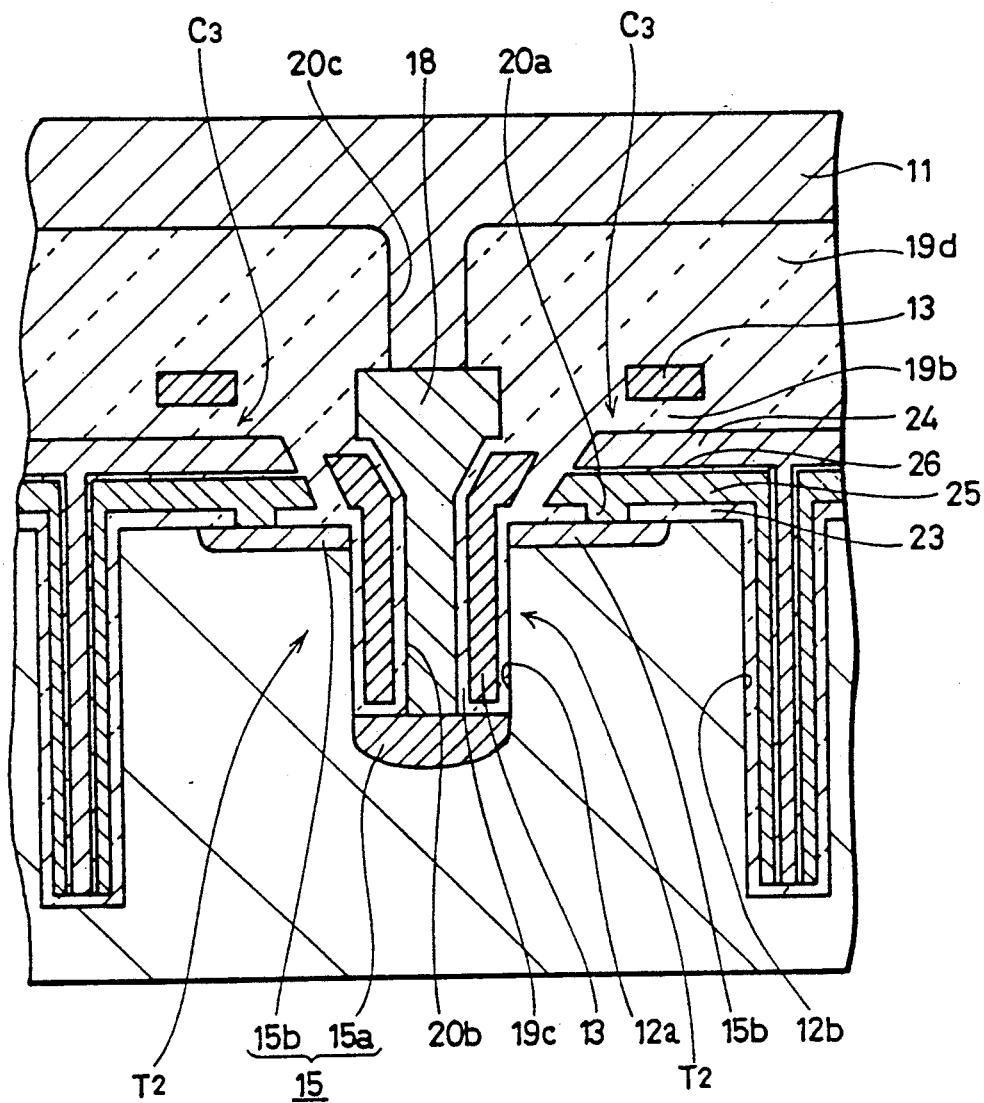
FIG. 8 is a cross sectional view corresponding to that of FIG. 6, showing a DRAM having a cell structure in which a trench serves both as a capacitor and isolation, as a semiconductor device in accordance with another embodiment of the present invention.
Figure 9:
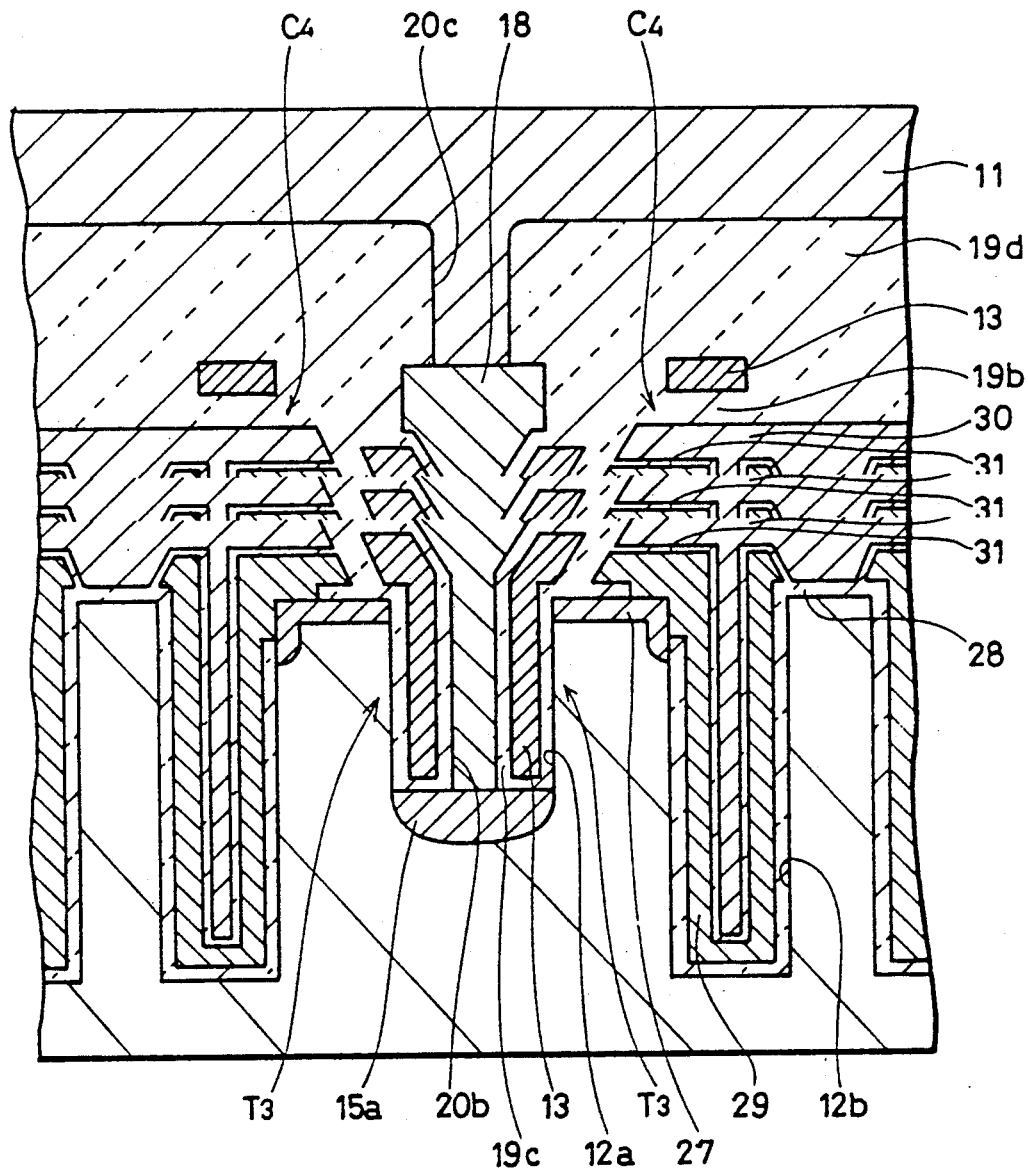
FIG. 9 is a cross sectional view corresponding to FIG. 6 showing a DRAM having a normal trench type capacitor cell structure, as a semiconductor device in accordance with a further embodiment of the present invention.

FIG. 8 is a cross sectional view of a DRAM having a cell structure in which the trench serves both as a capacitor and an isolation, as the semiconductor device in accordance with another embodiment of the present invention. FIG. 9 is a cross sectional view of a DRAM having a normal trench type capacitor cell structure as the semiconductor device in accordance with a further embodiment of the present invention. These embodiments of the present invention will be described in the following with reference to FIGS. 8 and 9.

Referring to FIG. 8, a first trench 12a and a second trench 12b are provided adjacent to each other on the same main surface of the substrate 1. A transistor T2 is formed in the first trench 12a. A capacitor C3 is formed from the main surface portion of the substrate 1 to the bottom surface portion of the second trench 12b. In this capacitor C3, a cell plate 24 is formed in a T shape. The end portion extending from the center of the lower surface of the cell plate 24 to the center of the second trench 12b is in contact with a storage node insulating film 23 which is formed extending from the main surface of the substrate 1 to the inner wall surface of the second trench 12b. A storage node 25 and a capacitor gate oxide film 26 are respectively formed between the cell plate 24 and the storage node insulating film 23 to have an inverted L shaped. By interposing the capacitor gate oxide film 26, opposing electrodes formed of the cell plate 24 and the storage node 25 are provided. The capacitor C3 is formed on the inner wall portion of the second trench 12 and on the main surface portion of the substrate 1 in this manner. An adjacent capacitor C3 is formed in the second trench 12b, separated by the cell plate 24. The adjacent memory cells including the capacitors C3 are structured such that they are isolated from each other with the adjacent capacitors C3 insulated by the storage node insulating film 23 formed on the bottom surface portion of the second trench 12b.

Referring to FIG. 9, a first trench 12a and a second trench 12b are provided adjacent with each other on the same main surface of the substrate 1. A transistor T3 is formed in the first trench 12a. A capacitor C4 is formed in the second trench 12b. The transistor T3 has a source region 27 which is formed to have a lateral L shape extending from the substrate 1 to the sidewall portion near the opening of the second trench 12b. The capacitor C4 is connected to the source region 27 at one corner of the opening of the second trench 12b. The capacitor C4 has a cell plate 30 which is also used by the adjacent capacitor C4. The cell plate 30 is formed to have a T shape so as to couple adjacent two capacitors C4 in parallel. The cell plate 30 is formed to extend from one lower surface to the center of the second trench 12b, with the end portion reached near the bottom surface portion of the second trench 12b. A storage node insulating film 28 is formed on the entire surface of the inner wall surface of the second trench 12b except one corner of the opening of the trench. A capacitor gate oxide film 31 and a storage node 29 are formed between the cell plate 30 and the storage node insulating film 28. By interposing the capacitor gate oxide film 31, opposing electrodes formed of the cell plate 30 and the storage node 29 are formed. The adjacent two capacitors C4 coupled in parallel by the cell plate 30 are insulated by the storage node insulating film 28, whereby the memory cells are isolated from each other.

As described above, in the memory cells having the structure of FIGS. 8 and 9, the transistor portion is formed in the first trench 12a and the capacitor portion is formed in the second trench 12b. Therefore, the memory cells shown in FIGS. 8 and 9 have larger capacitances compared with the memory cell shown in FIG. 6, and the size of the memory cell can be reduced. Therefore, the memory cell structures suitable for improving the degree of integration and density can be provided.

The transistors T2 and T3 shown in FIGS. 6, 8 and 9 are respectively formed in the trench 12 and from the bottom surface portion of the first trench 12a to the main surface portion of the substrate 1 in the above described embodiments. However, the transistors may be formed in the trench 12 and from the bottom surface portion to the sidewall portion of the trench 12a.

Although description was given of a case in which the memory cell is constituted by a transistor portion and a capacitor portion in the foregoing, the present invention is not limited to this and it can be applied to other structures in which the transistor portion and the capacitor portion are not directly connected to each other, or to a single transistor portion. In addition, the drain region 15a of the transistor portion is formed in the trench 12 or at the bottom surface portion of the trench 12a in the above described embodiments. The source regions 15b and 27 may be formed on the bottom surface portion of the trenches 12 and 12a. The same effect as in the above described embodiment can be also provided.

As described above, according to the present invention, a transistor is formed such that at least a portion of a channel is formed on a sidewall portion of a trench provided in one main surface of the substrate. In addition, an electrode layer arranged on the main surface of the substrate is connected to the impurity region which will be the source or drain region provided at the bottom surface portion of the trench through a contact hole provided in the trench. Therefore, good electrical connection between the impurity region and the electrode layer can be provided. In addition, a semiconductor device can be provided in which transistors having superior electric characteristics are highly integrated. The channel length of the transistor can be adjusted, preventing the short channel effect. In addition, the semiconductor memory device suitable for improving the degree of integration and density of memory cells can be provided which can be easily manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a trench type structure, comprising:
   a semiconductor substrate of a first conductivity type having a main surface and a trench formed on the main surface;
   a first impurity region of a second conductivity type formed on said semiconductor substrate at a bottom surface portion of said trench;
   an insulating layer formed on the main surface of said semiconductor substrate and on a sidewall of said trench, said insulating layer having a hole extending to the bottom surface portion of said trench and to said first impurity region;
   a conductive layer formed on said insulating layer and being in contact with said first impurity region at the bottom surface of said trench through said hole, said conducting layer constituting a first electrode;
   a pair of gates each interposed between said conductive layer and a sidewall of said trench, formed along a respective sidewall of said trench and insulated therefrom by said insulating layer; and
   a pair of second impurity regions of the second conductivity type formed on the main surface of said semiconductor substrate including a portion of the sidewall of said trench, connected to respective second electrodes; wherein
   said first impurity region, said pair of second impurity regions and said pair of gates constitute a field effect device, and at least a portion of a channel region is formed on a sidewall of said trench between said first impurity region and one of said second impurity regions.

2. A semiconductor device having a trench type structure according to claim 1, further comprising an insulating layer formed on said conductive layer and having a hole therethrough extending to a surface of said conductive layer, and a wiring layer formed on the insulating layer, said wiring layer being in contact with said conductive layer through the hole.

3. A semiconductor device having a trench type structure according to claim 2, wherein said conductive layer has a bottom surface directly contacting said first impurity region and a top surface directly contacting said wiring layer, said top surface having a surface area larger than that of said bottom surface.

4. A semiconductor device having a trench type structure according to claim 1, further comprising a capacitor portion (C2) connected to said field effect device on the main surface of said semiconductor substrate.

5. A semiconductor device having a trench type structure according to claim 4, wherein said capacitor portion comprises a second conductive layer formed in contact with one of said second impurity regions, a capacitor insulating film formed on a surface of the second conductive layer and a third conductive layer formed on the capacitor insulating film, thereby constituting a capacitor for storing charges.

6. A semiconductor device having a trench type structure according to claim 5, wherein said second conductive layer is formed on an insulation layer on a bottom surface and on a sidewall of a second trench formed in the main surface of said semiconductor substrate.

7. A semiconductor device having a trench type structure according to claim 6, wherein said capacitor insulating film and said third conductive layer are formed on said second conductive layer along the sidewall and a bottom surface of said second trench.

8. A semiconductor device having a trench type structure according to claim 7, wherein
   the surface of said second trench is divided into a first lateral half and a second lateral half by said insulation layer formed on the bottom surface of said second trench,
   a first portion of said second conductive layer formed on the sidewall and the bottom surface of one lateral half of said second trench being isolated from a second portion of said second conductive layer portion formed on the sidewall and bottom surface of the other lateral half of said second trench by said insulating film, and wherein said third conductive layer and said first and second portions of said second conductive layer constitute separate capacitors for storing charges.

9. A semiconductor structure including a substrate having a trench formed at a surface thereof and extending into the substrate, a memory cell comprising a bit line, a capacitive charge storage means and a transistor, wherein
said charge storage means includes a pair of capacitors each having a storage node, and
said transistor comprises:
a first impurity region formed in a first portion of said trench remote from said surface of said semiconductor substrate,
a pair of gates formed on an insulator layer on a sidewall of said trench,
a pair of second impurity regions formed in portions of said sidewall of said trench and spaced apart from said first impurity region, said portions of said sidewall of said trench being closer to said surface of said semiconductor substrate than said first impurity region,
said first impurity region being connected to said bit line, and
said second impurity regions being connected to respectively said storage nodes.

10. A semiconductor device having a trench type structure, comprising:
a semiconductor substrate of a first conductivity type having a main surface and a trench formed on the main surface;
a first source/drain region of a second conductivity type of a field effect transistor formed on said semiconductor substrate at a bottom surface portion of said trench;
an insulating layer formed on a sidewall of said trench extending to an exposed portion of said first impurity region;
a conductive layer for transferring a signal appearing at said first source/drain region and formed on said insulating layer to be directly in contact with said first source/drain region at the bottom surface of said trench;
a pair of gates of said field effect transistor each interposed between said conductive layer and said insulating layer on a sidewall of said trench, formed along the sidewall of said trench and isolated from said conductive layer; and
a pair of second source/drain regions of the second conductivity type of said field effect transistor formed on the main surface of said semiconductor substrate including a portion of the sidewall of said trench; and wherein
a channel region of said field effect transistor is formed on said semiconductor substrate positioned at the sidewall of said trench between said first and each of said second source/drain regions.

11. A semiconductor device having a trench type structure according to claim 10, further comprising an insulating layer formed on said conductive layer and having a hole therethrough extending to a surface of said conductive layer, and a wiring layer formed on the insulating layer, said writing layer being in contact with said conductive layer through the hole.

12. A semiconductor device having a trench type structure according to claim 11, wherein said conductive layer has a bottom surface directly contacting said first impurity region and a top surface directly contacting said wiring layer, said top surface having a surface area larger than that of said bottom surface.

13. A semiconductor device having a trench type structure according to claim 10, further comprising a capacitor portion connected to said field effect transistor on the main surface of said semiconductor substrate.

14. A semiconductor device having a trench type structure according to claim 13, wherein said capacitor portion comprises a second conductive layer formed in contact with one of said second source/drain regions, a capacitor insulating film formed on a surface of the second conductive layer and a third conductive layer formed on the capacitor insulating film, thereby constituting a capacitor for storing charges.

15. A semiconductor device having a trench type structure according to claim 14, wherein said second conductive layer is formed on an insulation layer on a bottom surface and on a sidewall of a second trench formed in the main surface of said semiconductor substrate.

16. A semiconductor device having a trench type structure according to claim 15, wherein said capacitor insulating film and said third conductive layer are formed on said second conductive layer along the sidewall and a bottom surface of said second trench.

17. A semiconductor device having a trench type structure according to claim 16, wherein
the surface of said second trench is divided into a first lateral half and a second lateral half by said insulation layer formed on the bottom surface of said second trench;
a first portion of said second conductive layer formed on the sidewall and the bottom surface of one lateral half of said second trench being isolated from a second portion of said second conductive layer portion formed on the sidewall and bottom surface of the other lateral half of said second trench, and wherein
said third conductive layer and said first and second portions of said second conductive layer constitute separate capacitors for storing charges.

18. A semiconductor device having a trench type structure, comprising:
a semiconductor substrate of a first conductivity type having a main surface and a trench formed on the main surface;
a first impurity region of a second conductivity type formed on said semiconductor substrate at a bottom surface portion of said trench;
an insulating layer formed on the main surface of said semiconductor substrate and on a sidewall of said trench, said insulating layer having a hole extending to the bottom surface portion of said trench and to said first impurity region;
a conductive layer formed on said insulating layer and being in contact with said first impurity region at the bottom surface of said trench through said hole, said conducting layer constituting a first electrode;
a gate interposed at least between said conductive layer and the sidewall of said trench, formed along the sidewall of said trench and insulated therefrom by said insulating layer;
a second impurity region of the second conductivity type formed on the main surface of said semiconductor substrate including a portion of the sidewall of said trench, connected to a second electrode;

said first impurity region, said second impurity region and said gate forming a field effect device, with at least a portion of a channel region formed on the sidewall of said trench between said first impurity region and said second impurity region;

a capacitor portion connected to said field effect device on the main surface of said semiconductor substrate, said capacitor portion comprising a second conductive layer formed in contact with said second impurity region, a capacitor insulating film formed on a surface of the second conductive layer and a third conductive layer formed on the capacitor insulating film; and wherein said second conductive layer is formed on an insulation layer on a bottom surface and on a sidewall of a second trench formed in the main surface of said semiconductor substrate and said second impurity region includes a region formed along the side wall of the second trench.

* * * * *

UNITED STATES PATENT AND TRADEMARK OFFICE
CERTIFICATE OF CORRECTION

PATENT NO. : 5,032,882

DATED : July 16, 1991

INVENTOR(S) : Okumura et al

Figure 1:
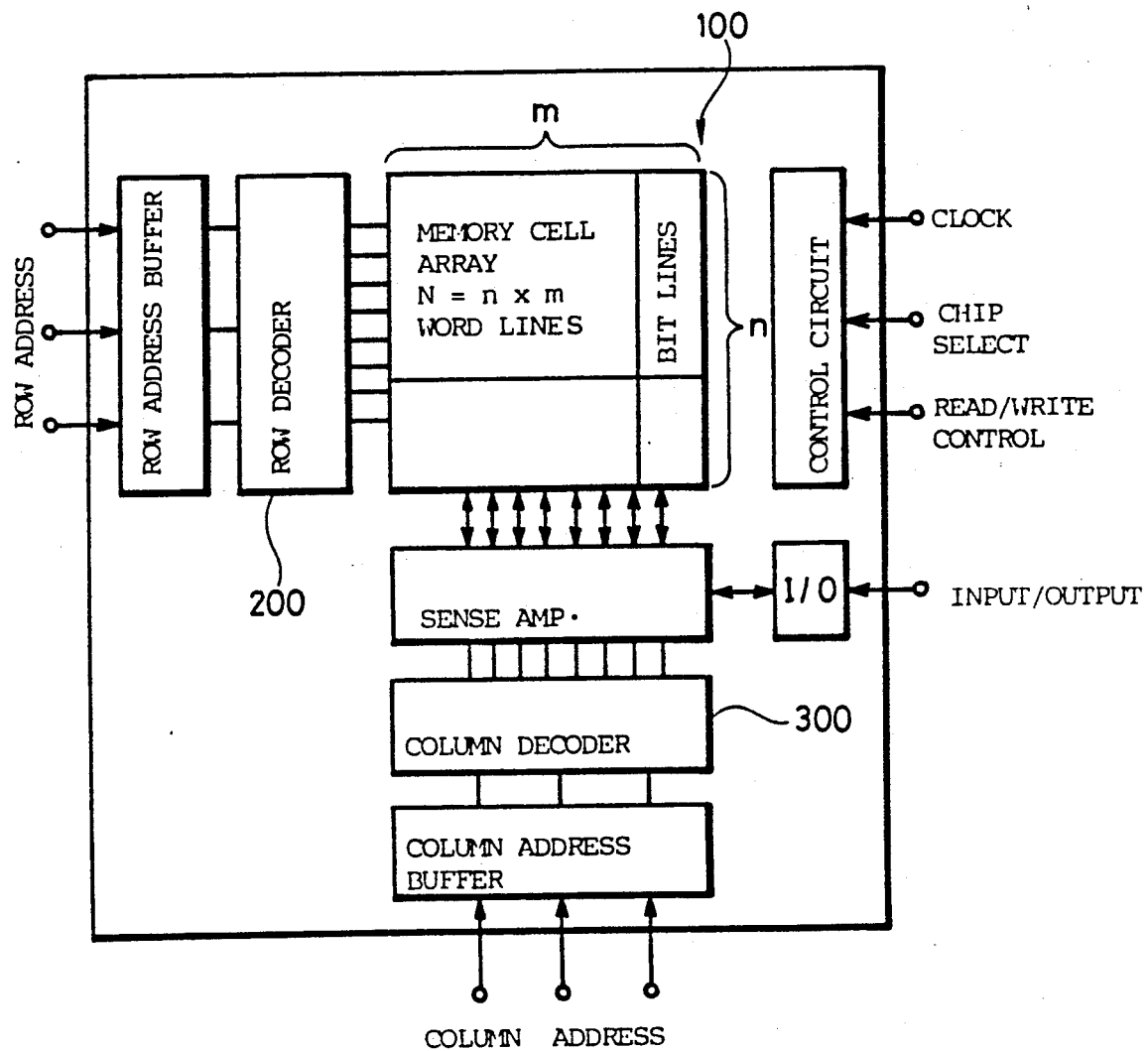
FIG. 1 is a block diagram showing a whole structure of a conventional DRAM.
Figure 2:
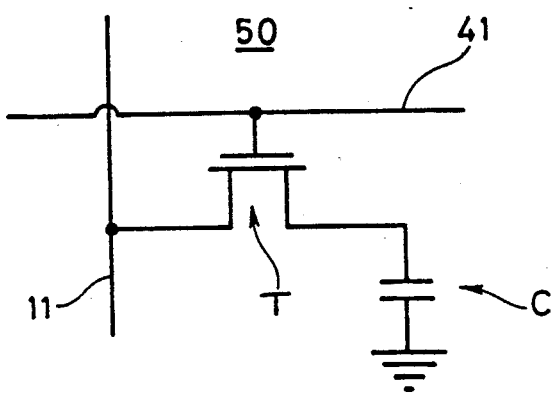
FIG. 2 is an equivalent circuit diagram corresponding to one memory cell of the DRAM shown in FIG. 1.
Figure 3:
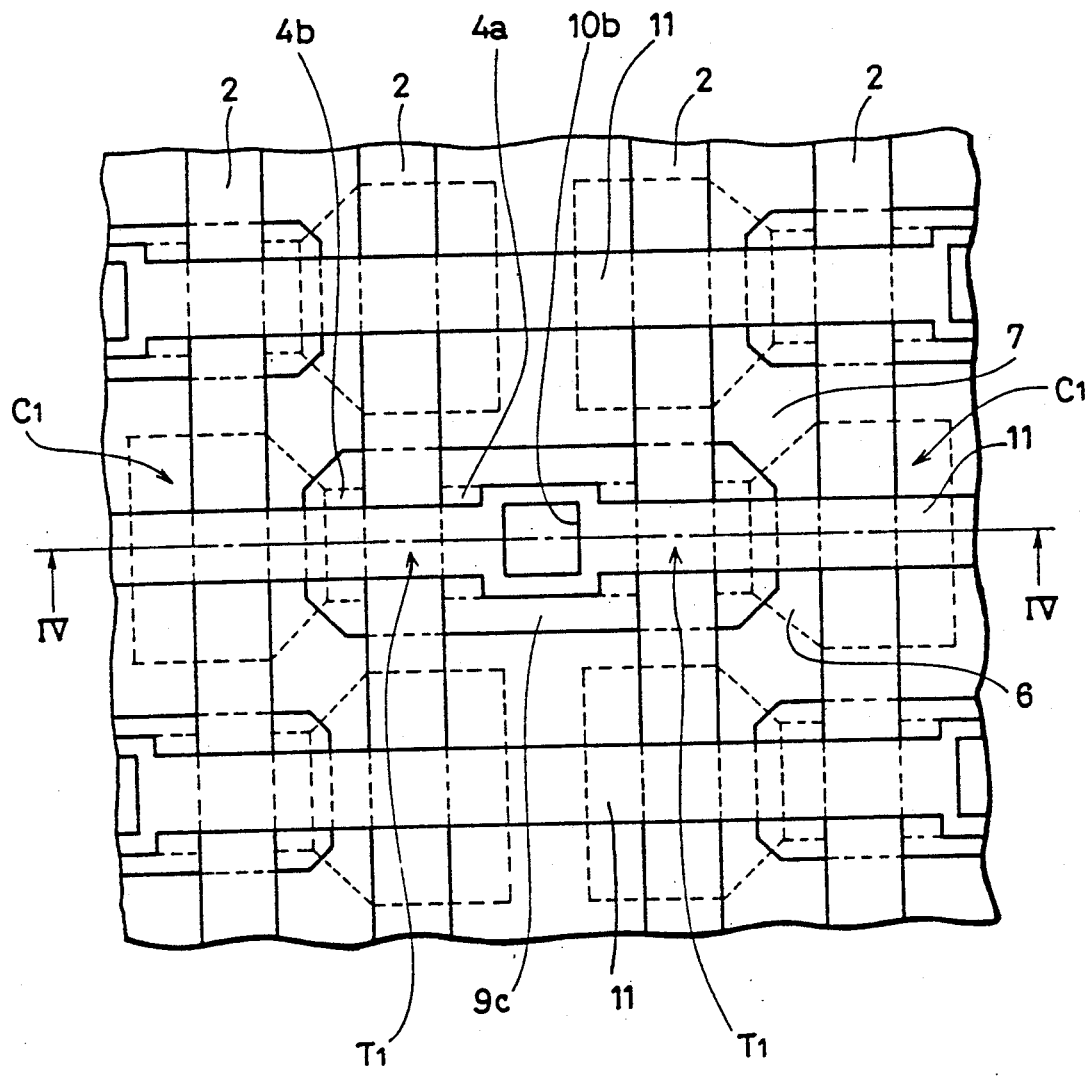
FIG. 3 is a partial plan view of a conventional DRAM showing a memory cell region having a stacked capacitor cell structure.
Figure 4:
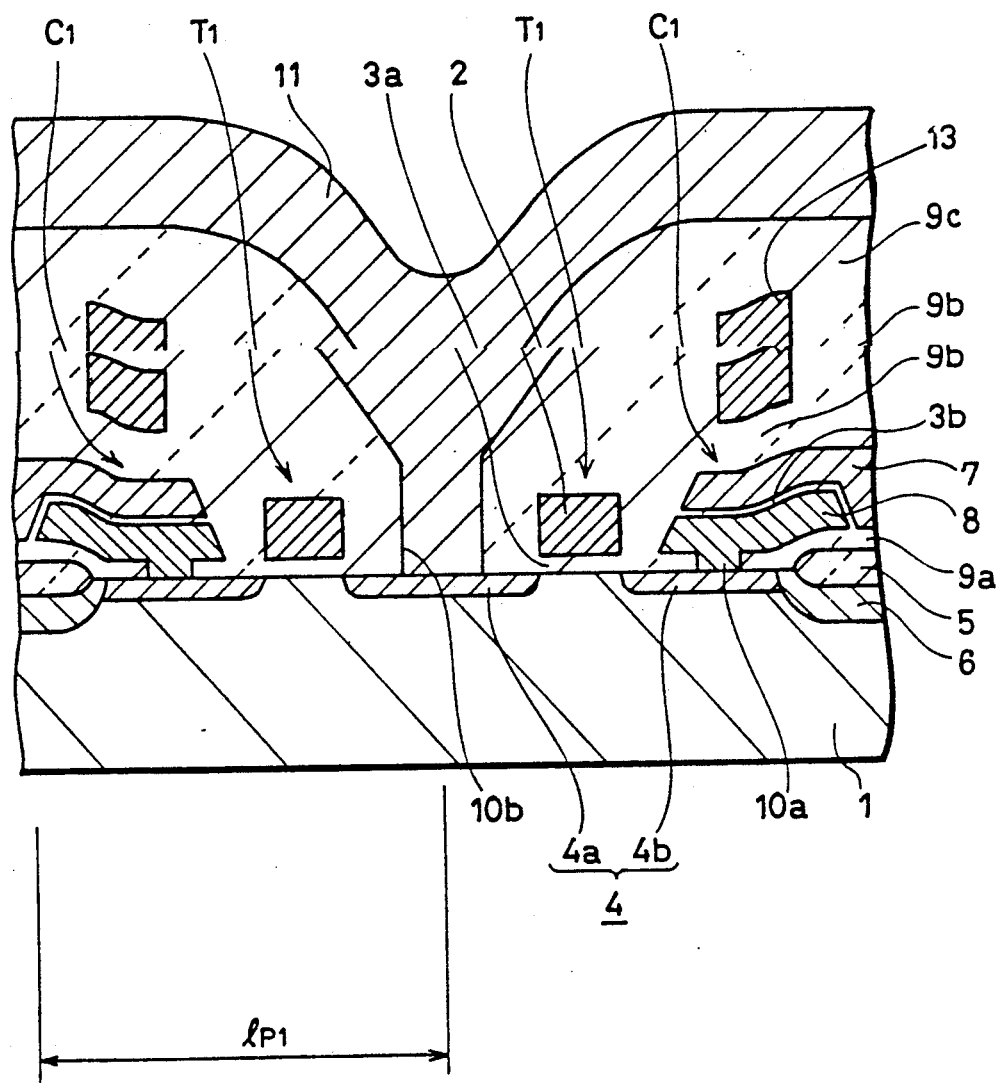
FIG. 4 is a cross sectional view taken along the line IV—IV of FIG. 3.

It is certified that error appears in the above-indentified patent and that said Letters Patent is hereby corrected as shown below:

In the drawings please replace Figures 4 and 9, with the corrected Figures 4 and 9, as shown on the attached pages.

Signed and Sealed this

Twentieth Day of July, 1993

Attest:

MICHAEL K. KIRK

Attesting Officer

Acting Commissioner of Patents and Trademarks

UNITED STATES PATENT AND TRADEMARK OFFICE
CERTIFICATE OF CORRECTION

PATENT NO. : 5,032,882
DATED : July 16, 1991
INVENTOR(S) : Okumura et al

It is certified that error appears in the above-indentified patent and that said Letters Patent is hereby corrected as shown below:

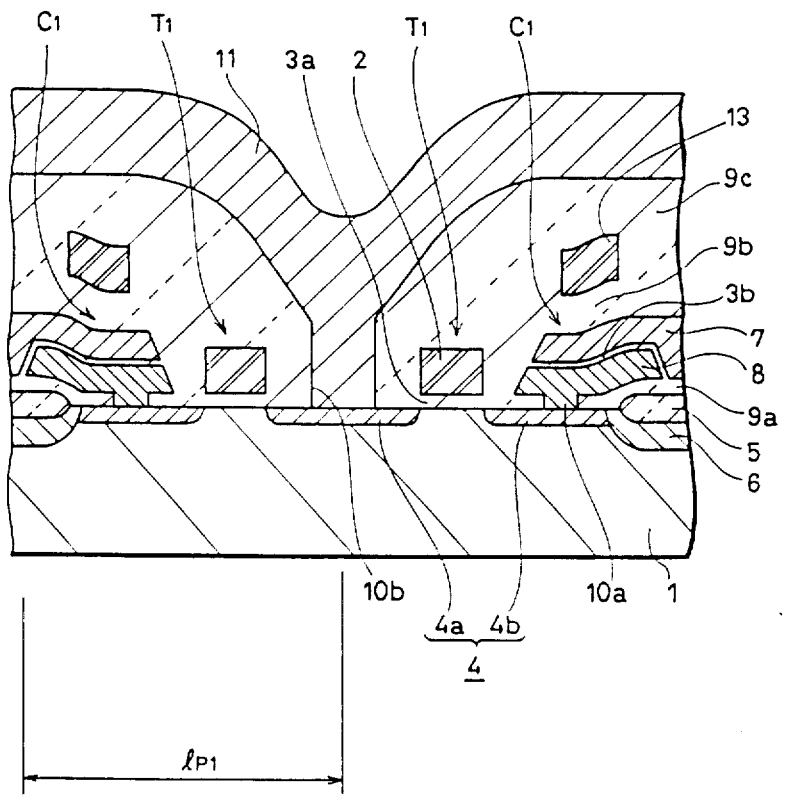

FIG. 4  PRIOR ART

UNITED STATES PATENT AND TRADEMARK OFFICE
CERTIFICATE OF CORRECTION

PATENT NO. : 5,032,882
DATED : July 16, 1991
INVENTOR(S) : Okumura et al

It is certified that error appears in the above-indentified patent and that said Letters Patent is hereby corrected as shown below:

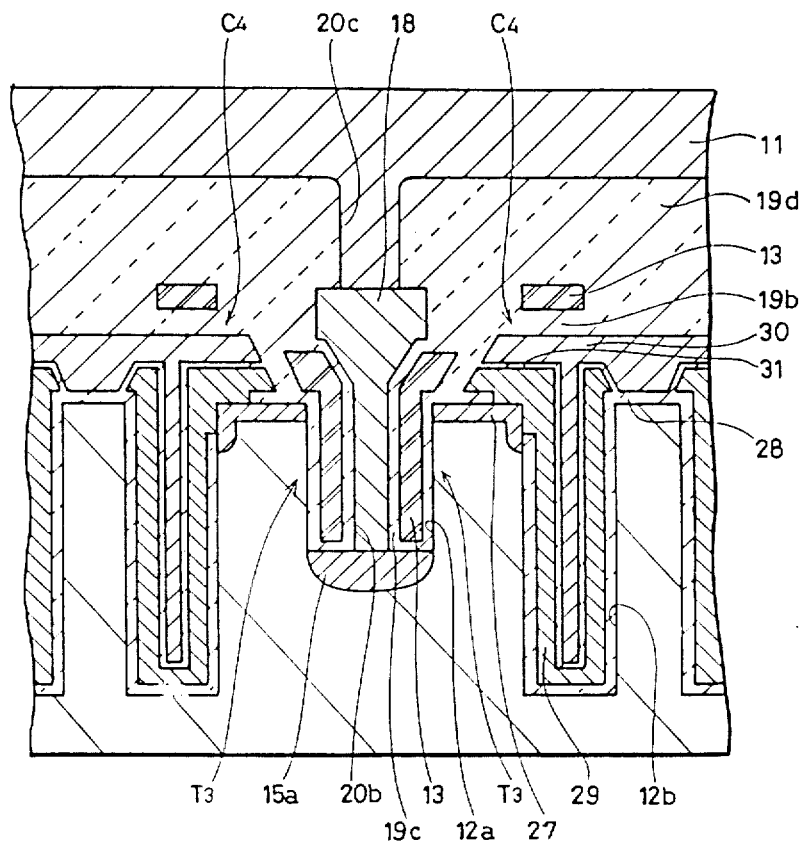

FIG.9